United States Patent
Borneis et al.

(10) Patent No.: US 6,243,405 B1
(45) Date of Patent: Jun. 5, 2001

(54) VERY STABLE EXCIMER OR MOLECULAR FLUORINE LASER

(75) Inventors: Stefan Borneis, Fulda; Klaus Brunwinkel; Uwe Stamm, both of Göttingen; Frank Voss, Bad Gandersheim, all of (DE)

(73) Assignee: Lambda Physik AG, Gottingen (DE)

( * ) Notice: Subject to any disclaimer, the term of this patent is extended or adjusted under 35 U.S.C. 154(b) by 0 days.

(21) Appl. No.: 09/484,818

(22) Filed: Jan. 18, 2000

Related U.S. Application Data

(60) Provisional application No. 60/127,062, filed on Mar. 31, 1999, and provisional application No. 60/124,785, filed on Mar. 17, 1999.

(51) Int. Cl.[7] ................................................... H01S 3/22
(52) U.S. Cl. ............................. 372/57; 372/59; 372/60; 372/25; 372/31
(58) Field of Search ................................ 372/59, 57, 60, 372/25, 31

(56) References Cited

U.S. PATENT DOCUMENTS

| | | | |
|---|---|---|---|
| 5,090,020 | * 2/1992 | Bedwell | 372/59 |
| 5,143,659 | * 9/1992 | Hakuta et al. | 372/59 |
| 5,440,578 | * 8/1995 | Sandstrom | 372/59 |
| 5,978,406 | * 11/1999 | Rokni et al. | 372/58 |
| 6,157,662 | * 12/2000 | Scaggs et al. | 372/60 |

\* cited by examiner

*Primary Examiner*—Leon Scott, Jr.
(74) *Attorney, Agent, or Firm*—Sierra Patent Group, Ltd.; Andrew V. Smith

(57) ABSTRACT

A technique of stabalizing during operation a gas mixture with a gas composition initially provided within a discharge chamber of an excimer or molecular fluorine gas discharge laser includes monitoring a temporal pulse shape of the laser beam and adjusting and/or determining the status of the gas mixture based on the monitored temporal pulse shape. The monitored temporal pulse shape is preferably compared with a reference temporal pulse shape. The difference or deviation between the monitored temporal pulse shape and a reference temporal pulse shape is calculated. The amount of and intervals between gas replenishment actions are determined based on the calculated deviation. The energy of the beam is also monitored and the driving voltage and gas actions are adjusted to stabilize the energy, energy stability and/or energy dose.

59 Claims, 5 Drawing Sheets

VERY STABLE EXCIMER OR MOLECULAR FLUORINE LASER

Priority

This application claims the benefit of priority to United States provisional patent application No. 60/127,062, filed Mar. 31, 1999 which claims benefit of 60/124,785 filed Mar. 17, 1999.

BACKGROUND OF THE INVENTION

1. Field of the Invention

The present invention relates to excimer and molecular fluorine lasers, and particularly to a laser gas mixture and output beam parameter stabilization technique.

2. Discussion of the Related Art

Excimer lasers are used in industrial applications such as optical microlithography, TFT annealing, and micromachining. Such lasers generally include a discharge chamber containing two or more gases such as a halogen and one or two rare gases. KrF (248 nm), ArF (193 nm), XeF (350 nm), KrCl (222 nm), XeCl (308 nm), and $F_2$ (157 nm) lasers are examples. As industrial processes are driven to the leading edge of technology, the stability of excimer laser output beam parameters should be kept as constant as possible over the lifetimes of the gas mixture and the laser itself. It is also important to maintain high discharge efficiencies for operating the laser at high repetition rates.

The efficiencies of excitation of the gas mixtures and various parameters of the output beams of these lasers vary sensitively with the compositions of their gas mixtures. An optimal gas mixture composition for a KrF laser has preferred gas mixture component ratios around 0.1% $F_2$/1% Kr/98.9% Ne (see U.S. Pat. No. 4,393,505, which is assigned to the same assignee as the present application and is hereby incorporated by reference into the present application). A $F_2$ laser may have a gas component ratio around 0.1% $F_2$/99.9% Ne (see U.S. patent application No. 09/317,526, which is assigned to the same assignee as the present application and is hereby incorporated by reference into the present application). Small amounts of Xe may be added to rare gas halide gas mixtures, as well (see R. S. Taylor and K. E. Leopold, Transmission Properties of Spark Preionization Radiation in Rare-Gas Halide Laser Gas Mixes, IEEE Journal of Quantum Electronics, pp. 2195–2207, vol. 31, no. 12 (Dec. 1995; see also U.S. patent application No. 60/160,126, assigned to the same assignee as the present application and hereby incorporated by reference).

Any deviation from the optimum gas compositions of these or other excimer or molecular lasers would typically result in instabilities or reductions from optimal of one or more output beam parameters such as beam energy, energy and energy dose stability, temporal pulse width and shape, temporal coherence, spatial coherence, discharge width, bandwidth, and long and short axial beam profiles and divergences. Especially important in this regard is the concentration (or partial pressure) of the halogen-containing species, e.g., $F_2$ or HCl, in the gas mixture. The depletion of the rare gases, e.g., Kr and Ne for a KrF laser or Xe and a buffer gas for a XeCl laser, is low in comparison to that for the $F_2$, although these rare gases are also replenished at longer intervals.

It is not easy, however, to directly measure the halogen concentration within the laser tube for making rapid online adjustments (see U.S. Pat. No. 5,149,659 (disclosing monitoring chemical reactions in the gas mixture) and Japanese Patent No. JP 10341050 (disclosing a method wherein optical detection of a halogen specific emission is performed)). Therefore, advantageous methods applicable to industrial laser systems include using a known relationship between $F_2$ or HCl concentration and a laser parameter. In such a method, precise values of the parameter would be directly measured, and the $F_2$ or HCl concentration would be calculated from those values. In this way, the $F_2$ concentration may be indirectly monitored, and optimized.

Previously described methods for laser gas characterization include measuring the spectral width of the laser emission (see U.S. Pat. No. 5,450,436 to Mizoguchi et al.), measuring the spatial beam profile of the laser emission (see U.S. Pat. No. 5,642,374 to Wakabayashi et al.) and measuring other characteristics of the output beam such as bandwidth, coherence, driving voltage, amplified spontaneous emission or energy stability wherein a rough estimation of the status of the gas mixture may be made (see U.S. Pat. No. 5,440,578 to Sandstrom, U.S. Pat. No. 5,887,014 to Das, and U.S. patent applications No. 09/418,052, 09/167,653, 60/124,785, each application of which is assigned to the same assignee and is hereby incorporated by reference).

In the '653 application, a data set of an output parameter such as pulse energy and input parameter such as driving voltage is measured and compared to a stored "master" data set corresponding to an optimal gas composition such as is present in the discharge chamber after a new fill. From a comparison of the data values and/or the slopes of curves generated from the data sets, a present gas mixture status and appropriate gas replenishment procedures, if any, are determined and undertaken to reoptimize the gas mixture.

Another technique uses a mass spectrometer for precision analysis of the gas mixture composition (see U.S. Pat. No. 5,090,020 to Bedwell). However, a mass spec is an undesirably hefty and costly piece of equipment to incorporate into a continuously operating excimer or molecular laser system such as a KrF, ArF or $F_2$ laser system which are typical light sources used in microlithographic stepper or scanner systems. Yet another technique measures fluorine concentration in a gas mixture via monitoring chemical reactions (see U.S. Pat. No. 5,149,659 to Hakuta et al.), but this method is not suitable for use with a rapid online correction procedure. It is desired to have a precise technique for monitoring gas mixture status that is easily adaptable with current excimer or molecular laser systems and provides rapid online information.

In typical gas discharge lasers such as excimer or molecular fluorine lasers, a constant laser pulse energy is maintained in short-term notwithstanding the degradation of the gas mixture by regulating the driving voltage applied to the discharge. As mentioned above, long term regulation is achieved by gas replenishment actions such as halogen injections (HI), total pressure adjustments and partial gas replacement (PGR). The smoothed long-term stabilization of the gas mixture composition uses a regulation loop where input laser system parameter data are processed by a computer (see the '653 application, mentioned above).

In these typical laser systems, an energy detector is used to monitor the energy of the output laser beam. The computer receives the pulse energy data from the energy detector as well as driving voltage information from the electrical pulse power module. This information is not selective enough since the energy monitor signal is influenced not only by the gas but also by resonator optics degradation or misalignment. The typical operation mode is the so-called energy-constant mode where the pulse energy is kept constant by adjusting the driving high voltage of the electrical pulse power module. In this way one gets constant values from the energy monitor.

A change of the laser status which again can be caused by gas aging as well as by the status of the laser resonator leads to a change of the driving voltage. It is desired to operate the laser at an approximately constant driving voltage level. To achieve this an appropriate smoothed gas regulation procedure is necessary. In the example of an excimer laser, usually the halogen gas component ($F_2$ in KrF lasers, HCl in XeCl lasers) is depleted whereas the other gases (nobel gases Kr and Ne in KrF lasers, Xe and a buffer gas in XeCl lasers) are usually not depleted. Therefore $\mu$HI's or other suitable smoothed gas actions such as low flow rate continues flow replenishment are applied (see the '785 application, mentioned above, and U.S. Pat. No. 5,978,406, hereby incorporated by reference for the gas replenishment techniques provided therein).

SUMMARY OF THE INVENTION

It is an object of the invention to provide an excimer or molecular fluorine laser system with very stable output beam parameters.

It is a further object of the invention to provide stable output beam parameters by online control and stabilization of the composition of the laser active gas mixture.

It is a further object of the invention to provide a beam parameter and gas mixture status monitoring and control technique for rapidly and efficiently stabilizing the gas mixture and output beam parameters.

It is a further object of the invention to facilitate improvements in the lifetimes of the laser tube and the laser gas mixture by stabilizing the gas mixture and output beam parameters of an excimer or molecular fluorine laser.

The present invention meets the above objects by providing an excimer or molecular fluorine laser system including a detection system configured to measure a temporal pulse shape of a split-off portion of the output beam of the laser. A gas control unit of the laser performs gas replenishment actions based on an evaluation of a temporal pulse shape measured by the detection system.

A processor receives a temporal pulse shape signal from the detector indicative of the measured temporal pulse shape and preferably compares the received temporal pulse shape signal with a stored reference temporal pulse shape signal and corresponding to a desired temporal pulse shape. The processor generates a pulse shape deviation signal based on a difference between the received temporal pulse shape signal and the reference temporal pulse shape signal.

The deviation signal is preferably calculated in one or more of several ways depending on the specifications of the particular application. A first way is to calculate the square of the difference between measured intensity and reference intensity integrated over the entire pulse. A second way of determining the deviation signal is to calculate the difference between the peak measured intensity and the peak reference intensity. A third way to determine the deviation signal is to calculate the difference between the ratio of intensities between two maxima in the measured pulse shape and the ratio of intensities between the same maxima in the reference pulse shape. A fourth way is to calculate the difference between the measured pulse duration and the reference pulse. The measured and reference pulse durations may be the FWHM of the measured and reference pulse shapes, respectively, or the time integral squares of the respective measured and reference pulse shapes. A fifth way is to calculate the difference between integrated intensities over different time intervals of measured and reference temporal pulse shapes in order to compare the energy contents over the different time intervals of the laser pulse. The processor then sends the pulse shape deviation signal to the gas control unit that initiates a gas replenishment action based on the deviation signal.

The same or a different detector measures the energy of the split-off portion of the beam. In a preferred embodiment, a single detector measures the pulse energy of the split off beam portion, and an oscilloscope resolves the temporal pulse shape. The pulse shape signal is then received by the processor from the oscilloscope. The processor then also receives an energy signal directly from the detector indicating the measured energy of the beam.

The processor then generates an energy deviation signal based on a variation from a preset value of one or a combination of pulse energy, pulse energy stability and energy dose stability. The processor then sends the energy deviation signal to t he discharge circuit of the laser which adjusts a driving voltage based on the energy deviation signal. The received energy signal is also preferably used by the processor in determining the gas action that it will communicate to the gas control unit based also on the pulse shape deviation signal or another signal.

The combination of the pulse shape and energy deviation signals sent by the processor to the gas control unit and the discharge circuit serve to control and stabilize the composition of the gas mixture and the driving voltage to stabilize significant output beam parameters such as the pulse energy, pulse energy stability and energy dose stability, among others mentioned above and below.

Thus, the laser system preferably includes at least one detector for measuring the temporal pulse shape of the laser pulse and a sufficiently fast data acquisition system like an oscilloscope or a similar device for time resolving the measured signal of the detector, and the same or a different detector for measuring the pulse energy. Two control circuits, one for controlling the driving voltage and the other for controlling the gas control unit, are then manipulated by the processor to meet the above objects.

DETAILED DESCRIPTION OF THE PREFERRED EMBODIMENT

Figure 1:
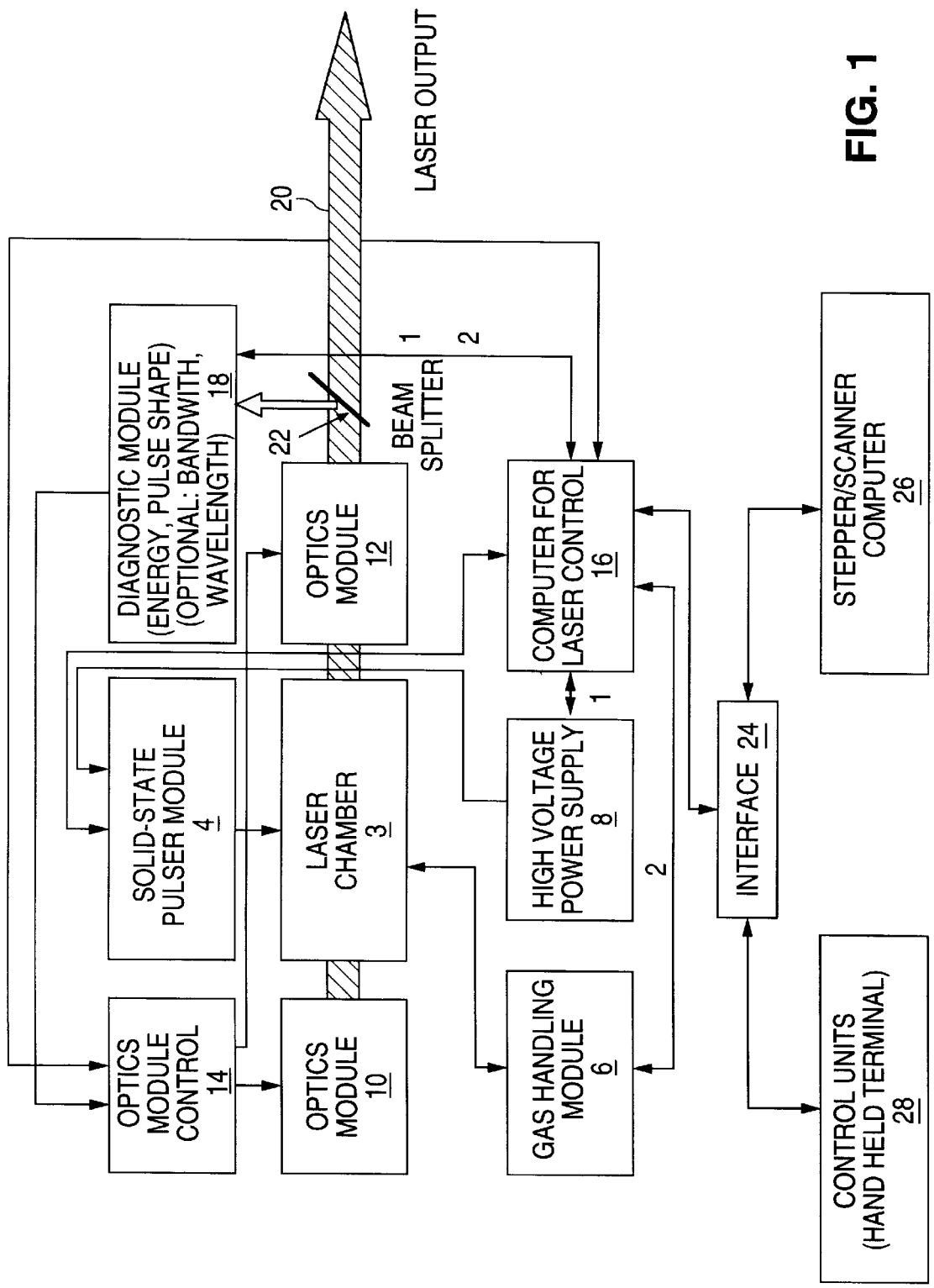
FIG. 1 shows a schematic block diagram of a laser system in accord with a first embodiment of the present invention.

FIG. 1 shows a schematic block diagram of a laser system in accord with a first embodiment of the present invention. FIG. 1 shows various modules of an excimer or molecular fluorine laser for deep ultraviolet (DUV) or vacuum ultraviolet (VUV) lithography. It is recognized in the present invention that it is desired to have a laser pulse with a duration as long as possible in accord with the lifetime of the illumination and projection optical system. The invention may be used advantageously to provide a stabilized long pulse emission.

Another specific field for the application of the present invention is the manufacturing of flat panel displays by TFT annealing. The TFT annealing process is strongly nonlinear. It is therefore recognized that stabilization of the temporal pulse shape and therefore peak intensity would be advantageous to produce reliable manufacturing results of the annealing process. Micromachining and other industrial application may also be performed advantageously with a similar laser system.

The system shown generally includes a laser chamber 3 connected with a solid-state pulser module 4 and a gas handling module 6. The solid-state pulser module 4 is powered by a high voltage power supply 8. The laser chamber 3 is surrounded by optics module 10 and optics module 12, forming a resonator. The optics modules 10 and 12 are controlled by an optics control module 14.

A computer 16 for laser control receives various inputs and controls various operating parameters of the system. A diagnostic module 18 receives and measures various parameters of a split off portion of the main beam 20 via a beam splitter 22. The beam 20 is the laser output to an imaging system (not shown). The laser control computer 16 communicates through an interface 24 with a stepper/scanner computer 26 and other control units 28.

The laser chamber 3 contains a laser gas mixture and includes a pair of main discharge electrodes and one or more preionization electrodes (not shown). Exemplary electrode configurations are described at U.S. provisional patent applications Ser. No. 60/162,845 and 60/160,182, and U.S. Pat. Nos. 4,860,300, 5,347,532 and 5,729,565, and German Patent No. DE 44 01 892, each of which is assigned to the same assignee as the present application and which is hereby incorporated by reference. Exemplary preionization assemblies are described in U.S. patent applications Ser. No. 09/247,887, and 60/162,645, each of which is assigned to the same assignee as the present application and which is hereby incorporated by reference.

The laser resonator which surrounds the laser chamber 3 containing the laser gas mixture includes optics module 10 including line-narrowing optics for a line narrowed excimer or molecular fluorine laser, which may be replaced by a high reflectivity mirror or the like if line-narrowing is not desired. Exemplary line-narrowing optics of the optics module 10 include a beam expander, an optional etalon and a diffraction grating, which produces a relatively high degree of dispersion, for a narrow band laser such as is used with a refractive or catadioptric optical lithography imaging system. For a semi-narrow band laser such as is used with an all-reflective imaging system, the grating is replaced with a highly reflective mirror, and a lower degree of dispersion is produced by a dispersive prism.

The beam expander of the line-narrowing optics of the optics module 10 typically includes one or more prisms. The beam expander may include other beam expanding optics such as a lens assembly or a converging/diverging lens pair. The grating or highly reflective mirror is preferably rotatable so that the wavelengths reflected into the acceptance angle of the resonator can be selected or tuned. The grating is typically used, particularly in KrF and ArF lasers, both for achieving narrow bandwidths and also for retroreflecting the beam. One or more dispersive prisms may also be used, and more than one etalon may be used.

Depending on the type and extent of line-narrowing and/or selection and tuning that is desired, and the particular laser that the line-narrowing optics of the optics module 10 is to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent applications Nos. 09/317,695, 09/130,277, 09/244,554, 09/317,527, 09/073,070, 60/124,241, 60/140,532, and 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application.

Optics module 12 preferably includes means for outcoupling the beam 20, such as a partially reflective resonator reflector. The beam 20 may be otherwise outcoupled such as by an intraresonator beam splitter or partially reflecting surface of another optical element, and the optics module 12 would in this case include a highly reflective mirror.

The laser chamber 3 is sealed by windows transparent to the wavelengths of the emitted laser radiation 14. The windows may be Brewster windows or may be aligned at another angle to the optical path of the resonating beam.

After a portion of the output beam 20 passes the outcoupler of the optics module 12, that output portion impinges upon the beam splitter 22 which reflects a portion of the beam to the diagnostic module 18. The portion of the outcoupled beam which traverses the beam splitter 22 is the output beam 20 of the laser, which propagates toward an industrial or experimental application such as an imaging system for photolithographic applications. The optics control module 14 controls the optics modules 10 and 12 such as by receiving and interpretting signals from the processor 16, and initiating realignment or reconfiguration procedures (see the '241, '695, 277, 554, and 527 applications mentioned above).

The solid-state pulser module 14 and high voltage power supply 8 supply electrical energy in compressed electrical pulses to the preionization and main electrodes within the laser chamber 3 to energize the gas mixture. The preferred pulser module and high voltage power supply are described at U.S. patent application Ser. Nos. 08/842,578, 08/822,451, and 09/390,146, each of which is assigned to the same assignee as the present application and which is hereby incorporated by reference into the present application. Other pulser modules are described at U.S. Pat. Nos. 5,982,800, 5,982,795, 5,940,421, 5,914,974, 5,949,806, 5,936,988, each of which is hereby incorporated by reference.

The diagnostic module 18 includes at least one energy detector. This detector measures the total energy of the beam portion which corresponds directly to the energy of the output beam 20. An optical attenuation coating may be formed on or near the detector to control the intensity of the radiation impinging upon the detector (see U.S. patent application Ser. No. 09/172,805, which is assigned to the same assignee as the present application and is hereby incorporated by reference).

The same or a different detector measures the time resolved pulse intensity, or pulse shape, of the beam portion (described in more detail below). If two detectors are used for these two measurements, then a beam splitter may be used to direct beam portions to the respective detectors.

A portion of the beam may be directed to a wavelength and bandwidth detection module, again preferably using a beamsplitter. The module preferably includes a monitor etalon such as is described at U.S. patent application Ser. No. 09/416,344 (see also U.S. Pat. No. 4,905,243), each of which is assigned to the same assignee as the present application and is hereby incorporated by reference. The wavelength and bandwidth detection module monitors the wavelength and bandwidth, and sends the wavelength and bandwidth information to the processor 16 and/or directly to the optics control module 14. The wavelength and bandwidth may be adjusted based on the information the processor 16 and/or optics control module 14 receives from the diagnostic module 18 based on its programming and the desired wavelength and/or bandwidth for the particular industrial application being performed.

The processor or control computer 16 receives and processes values of the pulse shape, energy, energy stability, wavelength, and bandwidth of the output beam and controls the line narrowing module to tune the wavelength and/or bandwidth, controls the power supply and pulser module 4 and 8 to control the energy. In addition, the computer 16 controls the gas handling module 6 which includes gas supply valves connected to various gas sources.

The laser gas mixture is initially filled into the laser chamber 3 during new fills. The gas composition for a very stable excimer laser in accord with the preferred embodiment uses helium or neon or a mixture of helium and neon as buffer gas, depending on the laser. Preferred gas composition are described at U.S. Pat. Nos. 4,393,405 and 4,977,573 and U.S. patent applications Ser. No. 09/317,526, 60/124,785, 09/418,052, 60/159,525 and 60/160,126, each of which is assigned to the same assignee and is hereby incorporated by reference into the present application. The concentration of the halogen containing species, i.e., fluorine or HCL, in the gas mixture may range from 0.003% to 1.00%, and is preferably around 0.1%. For the KrF and ArF lasers, the concentration of the krypton and argon, respectively, is around 1%. An additional rare gas may be added for increased energy stability and/or as an attenuator as described in the '126 application.

For the $F_2$-laser, an addition of Xenon and/or Argon may be used. The concentration of xenon or argon in the mixture may range from 0.0001% to 0.1%. For the ArF-laser, an addition of xenon or krypton may be used also having a concentration between 0.0001% to 0.1%. For the KrF-laser, an additive of xenon or argon may be used having a concentration again in a range from 0.0001% to 0.1%. For the XeCl-laser, an addition of argon or krypton may be used having a concentration in a range preferably between 0.0001% to 0.1%. For the XeF-laser, an addition of argon or krypton may be used having a concentration in a range between 0.0001% and 0.1%.

Halogen and rare gas injections, total pressure adjustments and gas replacement procedures are performed using the gas handling module 6 preferably including a vacuum pump, a valve network and one or more gas compartments. The gas handling module 6 receives gas via gas lines connected to gas containers, tanks, canisters and/or bottles. Preferred gas compositions of the various excimer lasers and the molecular fluorine laser and preferred gas handling and/or replenishment procedures of the present invention, other than specifically described herein, are described at U.S. Pat. Nos. 4,977,573 and 5,396,514 and U.S. patent applications Ser. No. 60/124,785, 09/418,052, 09/379,034, and 60/159,525, each of which is assigned to the same assignee as the present application and is hereby incorporated by reference. A Xe gas supply is also preferably included either internal or external to the laser system according to U.S. patent application Ser. No. 60/160,126, which is also assigned to the same assignee and is hereby incorporated by reference.

Using the laser system shown in FIG. 1, stabilization of laser output beam parameters is achieved by using two stabilization loops, one for total pulse energy and one for pulse shape. The first stabilization loop controls and stabilizes the laser pulse energy, pulse energy stability and energy dose stability. The stability of these beam parameters is maintained by controlling the high voltage of the laser power supply in a feedback loop using the processor and a programmed expert system (see the '034 application).

The path for stabilization of the pulse energy is labelled 1 in FIG. 1. The energy detector of the diagnostic module 18 measures the pulse energy of preferably each pulse. The energy value measured is preferably the total pulse energy of the measured pulse, and is alternatively the energy of an apertured and/or attenuated pulse. This pulse energy may be measured by an energy detector such as a photodiode, a photomultiplier tube, a pyroelectric detector or another detector described in U.S. patent application Ser. No. 09/172,805, which is assigned to the same assignee and is hereby incorporated by reference, wherein the energy of each pulse is converted and counted as a single detected voltage or current value.

The measured pulse energy is communicated to the computer 16. A deviation from a preset pulse energy is calculated and compensated for by adjusting the driving voltage applied to the discharge electrodes via the power supply 8 and pulser module 4. The computer 16 sends a pulse energy deviation signal to the power supply 8 so that the driving voltage may be adjusted. No gas actions are initiated from the pulse energy deviation from the preset value along stabilization loop 1. The processor monitors the high voltage, however, and may signal the gas handling module to perform a gas action if the driving voltage varies out of a preset range (see the '785 application). This pulse energy measured in stabilization loop 1 by the energy detector is not time-resolved over the duration of the pulse.

The second stabilization loop is labelled 2 in FIG. 1. As mentioned, the same energy detector used in stabilization loop 1 or a different detector of the diagnostic module 18 is used in stabilization loop 2. The detector is configured to time resolve the energy of the pulses and thus measures the temporal pulse shape (hereinafter "measured temporal pulse shape"), or the pulse intensity as a function of time over the temporal duration of the pulse. Thus, whenever the term "temporal pulse shape" is used herein, including in the claims, the term includes the time-resolved spectral intensity distribution of a laser output pulse which would permit a comparative analysis of features such as pulse shape, pulse width, pulse duration, intensity extrema (i.e., maxima and minima), and peak intensity. In contrast, the temporal pulse shape does not include the "total pulse energy" of the laser pulse.

The temporal pulse shape is also distinguished from the spatial profile of the laser beam. The "spatial profile" is the position resolved intensity distribution of the laser beam, or the beam intensity as a function of position over the spatial cross section of the beam. In one embodiment, the entire spatial profile of the pulse is preferably detected for measuring the temporal pulse shape. Alternatively, an apertured central portion of the spatial profile of the beam portion may be detected, particularly when the spatial profile, or intensity as a function of position over the spatial extent of the beam, is substantially gaussian or lorentzian across the width of the beam.

The measured temporal pulse shape information is communicated to the computer 16. The computer 16 preferably has a previously stored temporal pulse shape (hereinafter "preset temporal pulse shape") already in its RAM and/or ROM and/or on a disk. The preset temporal pulse shape is for comparison with the measured temporal pulse shape.

The temporal pulse shape has a unique dependence on specific characteristics of the laser gas mixture. Inspection of a temporal pulse shape measured during a start-up procedure or otherwise during laser operation indicates quantities relating to the laser gas mixture such as the relative apportionment of individual gases and the aging and degradation of the gas mixture. It follows that a comparison of two temporal pulse shapes measured at different times will reveal differences in the status of the laser gas mixture at the two different times when the temporal pulse shapes were measured.

The preset temporal pulse shape mentioned above which is measured in advance for later comparison with a measured temporal pulse shape, is preferably measured using a laser system which is optimally configured and has not yet aged. That is, a new fill of the laser gas mixture is performed preferably just before measuring the preset temporal pulse shape. At this time, because the gas mixture has not yet aged since the new fill, the apportionment of each of the gases, or the percentages of each gas that comprises the laser gas mixture, is optimal. Moreover, all of the hardware of the system including the electronics and optics, as well as the optical alignment of each optical module of the system, is also optimal when the preset temporal pulse shape is measured. Also, the gas mixture has preferably already reached its equilibrium temperature of operation when the preset temporal pulse shape is measured, i.e., after the gas mixture has finished "warming up".

After all of the above are verified, the preset temporal pulse shape is measured and stored in a memory accessible by the computer 16 for comparison with later measured data sets. The preset temporal pulse shape may typically be measured at the factory after manufacture of a new laser. The preset temporal pulse shape may be generated with the same laser or a different laser than the one it is desired to know the gas mixture status of later on.

More than one preset temporal pulse shape may be generated using a laser or lasers of various ages, wherein at least one preset temporal pulse shape is preferably generated using a new laser. As a gas laser itself ages, temporal pulse shapes measured when the gas mixture and other system components are otherwise optimal will typically vary. Thus, it is preferred to have several preset temporal pulse shapes corresponding to different age ranges of the laser itself.

Also, several calibration temporal pulse shapes are preferably measured and stored in the memory accessible by the computer 16 (see the '034 application wherein calibration data sets of energy versus driving voltage are measured and stored in a similar way). Each calibration temporal pulse shape corresponds to a different status of the gas mixture. A bank of temporal pulse shapes is then available corresponding to various aging states including various fluorine and/or rare gas concentrations for the processor to compare a later measured temporal pulse shape for determining the status of the gas mixture corresponding to the measured temporal pulse shape.

The computer generates a signal based on the results of the comparison between the measured and preset and/or calibration temporal pulse shapes. The signal is communicated to the gas handling module 6 which then determines whether a gas action is to be initiated. The gas handling module 6 may have a microprocessor of its own for performing this determination. Alternatively, the computer 16 itself determines whether a gas action is to be initiated based on the results of the comparison, and generates and sends a signal to the gas handling module to perform a particular gas action if the computer 16 determines that a gas action is called for.

The gas action may be a micro halogen and/or rare gas injection preferably in the form of an injection of a premix of gases including 95% or more of a buffer gas (see the '785 application). The gas actions may also be a mini gas replacement (MGR) or partial gas replacement (PGR) such as includes a release of gases from the discharge chamber (see again the '785 application). The gas action is performed to bring the output temporal pulse shape back to the preset temporal pulse shape, or the ongoing gas actions are performed to stabilize the temporal pulse shape around the preset temporal pulse shape, such as by maintaining the average temporal pulse shape at or near the preset temporal pulse shape.

Either or both of the diagnostic module 18 and the gas handling module 6 may contain microprocessors to calculate the deviation signals in the modules directly and to initiate the high voltage regulation and/or gas injections accordingly. There may be control subroutines that are performed without going through the central computer 16. The various modules 6, 14, 18, etc. may have microprocessors for performing various calculations based on information received from the computer 16 as well. The computer 16 may also signal the various modules 6, 14, 18, etc. to perform procedures based on signals received from the interface 24, or the optics module 14 or the pulser module 4, etc. in accord with the overall supervisory regulation control function of the computer 16.

Figure 2:
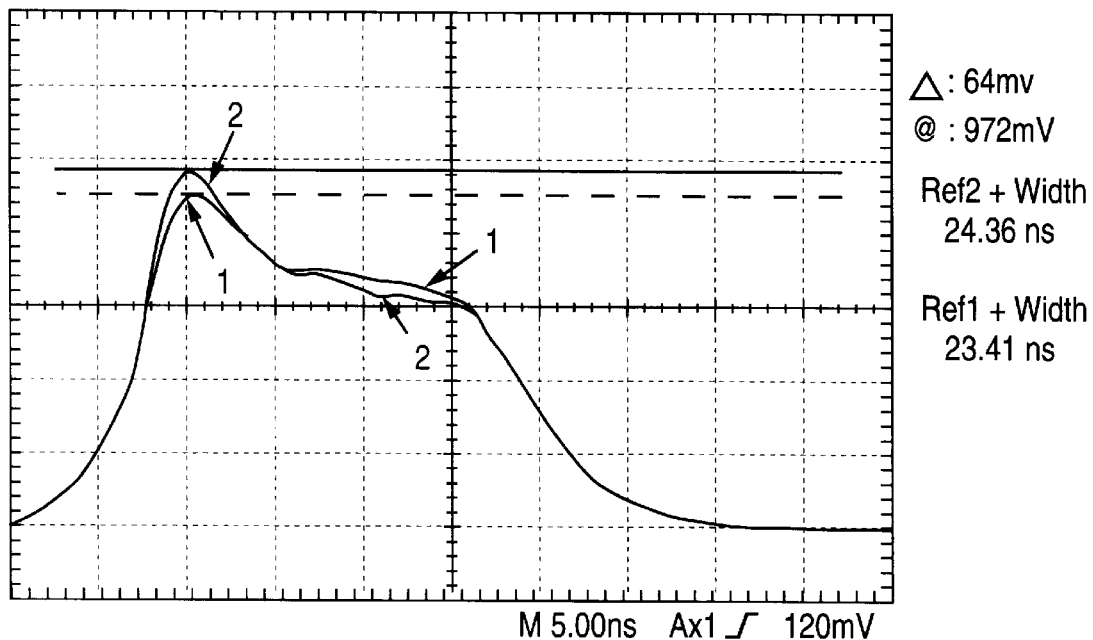
FIG. 2 shows two time-resolved pulse shapes of the output beam of the laser system of FIG. 1; a first (labelled "1") was measured before a gas action was performed and a second (labelled "2") was measured after the gas action.

FIG. 2 shows two temporal pulse shapes of the output beam of the laser system of FIG. 1. The first temporal pulse shape shown in FIG. 2 is labeled "1". The temporal pulse shape 1 was measured just before a gas action was performed. The second temporal pulse shape shown in FIG. 2 is labeled "2". The temporal pulse shape 2 was measured just after the gas action was performed. In accord with the present invention, the temporal pulse shape 1 was communicated to the computer 16 of FIG. 1. The computer 16 generated a deviation signal based on a comparison of temporal pulse shape 1 with a desired or preset temporal pulse shape stored or programmed in advance. The deviation signal was sent to the gas handling module 6 of FIG. 1. Upon receipt of the deviation signal, the gas handling module 6 initiated a gas action based on the deviation signal such as a micro halogen injection. The gas action adjusted the gas mixture to a more preferred gas composition. As a result, the next pulse generated by the laser system had a different temporal pulse shape 2. The temporal pulse shape 2 is advantageously closer to the preset temporal pulse shape than temporal pulse shape 1.

The temporal pulse shape regulation by gas injections can use as a regulation or deviation signal the deviation of the measured intensity distribution I(t), or measured temporal pulse shape, from the preset reference intensity distribution $I_0(t)$, or preset temporal pulse shape, in several ways. The deviation can be obtained using the entire function or a part or parts of the function I(t). Several examples are discussed below for obtaining the regulation or deviation signal.

The first example uses as a criterion for the regulation or deviation signal calculating and minimizing by an appropriate gas action if it is determined that a gas action should be performed, the following:

$$\int (I(t)-I_0(t))^2 dt.$$

This first exemplary deviation signal calculating technique uses the entire intensity spectrum of the measured temporal pulse shape. Either the integral is simply calculated by summation of distinct data points, each corresponding to a different point in time of the measured temporal pulse shape, and each data point subtracted from the corresponding point in the stored reference temporal pulse shape, or a smooth or analytic curve is generated from the data points comprising the measured and preset temporal pulses shapes and the integration actually performed.

An advantage of using this first exemplary technique is very high precision, in accord with a least squares fitting technique. That is, the sum of the differences $(I(t)-I_0(t))$ would be very nearly zero since the area under the curve of each of pulse shape 1 and pulse shape 2 is related to the energy of the respective pulses, and the energy of the laser pulses is maintained at a predetermined energy by adjusting the driving voltage. However, the sum of the squares of the differences $(I(t)-I_0(t))$ will vary more or less as the shapes of the curves vary depending on the halogen concentration in the gas mixture.

A second exemplary technique that may be used as the criterion for calculating the regulation or deviation signal is calculating and minimizing by an appropriate gas action a deviation between the intensity peak or maximum intensity in the measured temporal pulse shape from a reference value $I(peak)_{ref}$. The reference value $I(peak)_{ref}$ may be taken from a previously measured preset temporal pulse shape, and is preferably also the maximum in that preset pulse shape.

The intensity peak in the pulse shape is very different from the overall energy of the pulse. The total energy of a pulse may be related to the area under the curve of its temporal pulse shape, as mentioned above with respect to the first exemplary technique, whereas the intensity peak is the value of the highest measured intensity in the measured temporal pulse shape. This difference and an advantage of the present invention is clearly observed with reference to FIG. 2.

Referring to FIG. 2, the energy of a first measured pulse having pulse shape 1 and the energy of a second measured pulse having pulse shape 2, i.e., the respective areas under the curves of pulse shape 1 and pulse shape 2, may be observed to be substantially the same. However, the peak intensity of temporal pulse shape 1 ($I(peak)_1$) and the peak intensity of temporal pulse shape 2 ($I(peak)_2$) are clearly different, and will vary according to the halogen concentration in the gas mixture notwithstanding that the pulse energies corresponding to each of temporal pulse shapes 1 and 2 is the same.

A change in halogen concentration in the gas mixture is understood to have occurred between two pulses having differences in their respective temporal pulse shapes, in this example, in their respective peak intensities ($I(peak_1$ and $I(peak)_2$), while the energies of the respective pulses is kept the same by adjusting the driving voltage. The temporal pulse shape is thus an advantageously sensitive measure of the halogen concentration in the gas mixture. By performing gas replenishment based on temporal pulse shape, rather than based on pulse energy, a more sensitive algorithm for stabilizing the gas mixture is realized.

If it is determined, based on the amount of deviation between the peak intensity in the measured temporal pulse shape and the peak reference value $I(peak)_{ref}$, in accord with the second exemplary method, that a gas action is to be performed, then the computer 16 generates and sends a signal to the gas handling module 6 to initiate the gas action. Again alternatively, a deviation signal may be sent to the gas handling module 6 which determines whether and if so what type of gas action is to be performed. The gas action would be performed preferably to set the peak intensity of the measured temporal pulse shape, which is the current temporal pulse shape of the laser system, to the reference value $I(peak)_{ref}$.

A third exemplary technique that may be used as the criterion for calculating and minimizing the regulation or deviation signal is calculating the difference between the ratios of the peak intensities of two maxima in the measured and preset temporal pulse shape spectra. That is, two maxima in the temporal pulse shape spectrum of the laser system are selected. Then, the ratio of the peak intensities of the two maxima is calculated for the preset temporal pulse shape and for the measured temporal pulse shape. The difference between the two ratios is then also calculated. The computer 16 then generates and sends to the gas handling module 6 a deviation or regulation signal based on the difference calculation, so that the gas handling module 6 can initiate a gas action that will result in a minimization of that difference for the next laser pulse if it is determined that a gas action is to be performed based on the result of the calculation, or the magnitude of the deviation.

Figure 3A:
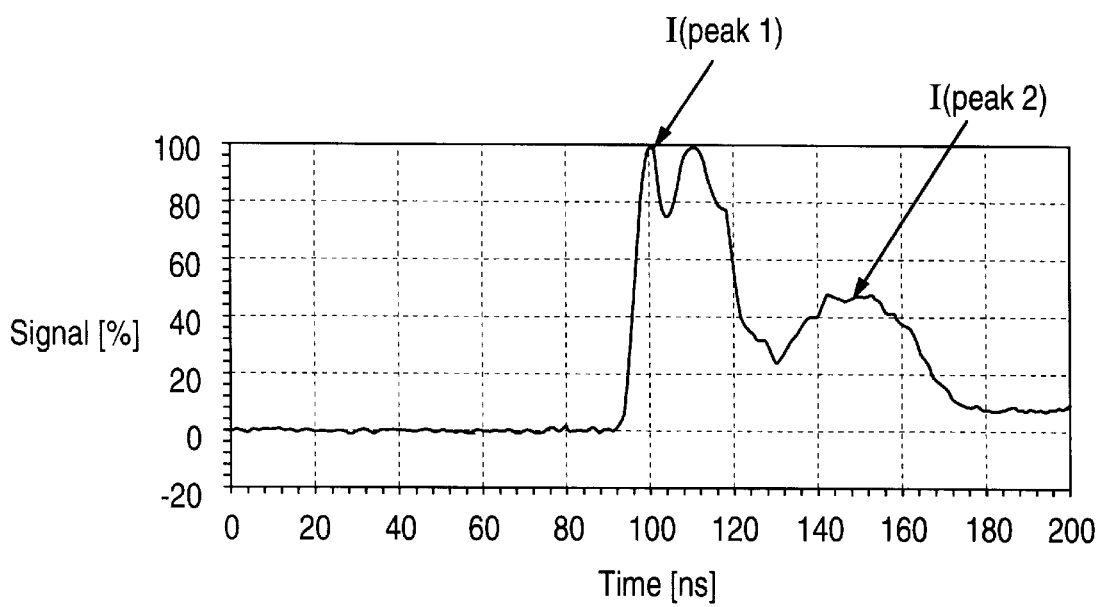
FIG. 3a shows a time-resolved pulse shape of the output beam of the laser system of FIG. 1 illustrating several maxima in the pulse shape.

FIG. 3a shows a temporal pulse shape of the output beam of the laser system of FIG. 1. Several maxima are observed in the temporal pulse shape of FIG. 3a. The two peaks selected for calculating the ratio are peak 1 and peak 2 as shown. The ratio of the peak intensities of peak 1 and peak 2, i.e., I(peak1)/I(peak2), is calculated for both the measured and preset temporal pulse shape spectra and the difference calculated, as described above.

An advantage of using either of the second and third exemplary techniques is technically easy implementation by electronic peak detection schemes, as well as the simplicity of the mathematical subtraction or division and subtraction calculation to be performed by the computer 16.

A fourth exemplary technique that may be used as the criterion for calculating and minimizing the regulation or deviation signal is calculating the difference between the temporal pulse durations of the measured and preset temporal pulse shape spectra. The temporal pulse durations may be calculated in at least two ways, and any other conventional techniques for finding the width of a spectral feature may be used.

The first technique for calculating the pulse durations is to calculate the full width at half maximum (FWHM) of the temporal pulse shapes. The "maximum" used can really be a selected one of several reference intensities, or the maximum may be a maximum of a fit to the measured temporal pulse shape, such as a gaussian or lorentzian fit. The second technique for calculating the pulse durations is to calculate the time integrated square (TIS) pulse duration. That is, the TIS can be calculated as follows: $1/TIS = \int I^2(t)\,dt/(\int I(t)dt)^2$.

This fourth exemplary technique is used to determine whether a gas action is to be performed, and if so, to minimize the difference between the pulse duration of the measured temporal pulse shape and that of the preset temporal pulse shape by initiating appropriate gas actions as described above.

Yet a fifth exemplary technique that may be used as the criterion for calculating and minimizing the regulation or deviation signal is calculating the difference between two or more peak intensity maxima in the measured and preset temporal pulse shape spectra. Referring to FIG. 3a, three peak intensity maxima are clearly observed. As an example, the intensities of peak 1, i.e., $I(peak)_1$, and peak 2, i.e., $I(peak)_2$, are found from the measured temporal pulse shape shown in FIG. 3a. $I(peak_{ref})_1$ and $I(peak_{ref})_2$ are found from a preset temporal pulse shape. Then, the differences between the measured and preset peak intensities are calculated, i.e., $\Delta I(peak)_1 = I(peak)_1 - I(peak_{ref})_1$ and $\Delta I(peak)_2 = I(peak)_2 I(peak_{ref})_2$. Then, either the sum, the sum of the absolute values, or the sum of the squares of $\Delta I(peak)_1$ and $\Delta I(peak)_2$ is calculated. Then, the processor 16 or a microprocessor of the gas handling module determines whether a gas action is to be performed based on the calculation, as described above in the other exemplary techniques. A similar routine could be performed with one or more minima.

Figure 3B:
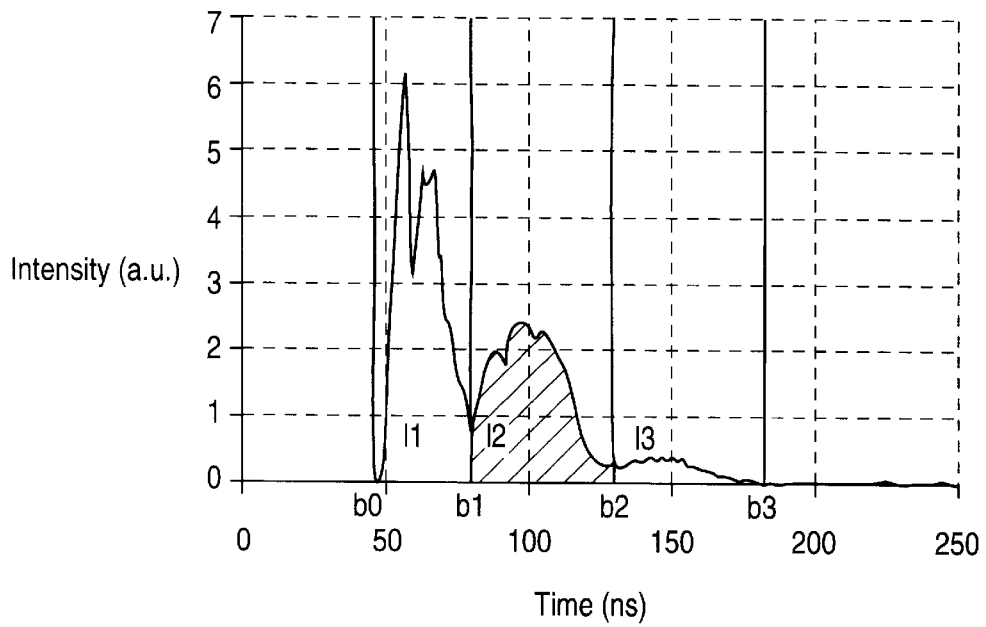
FIG. 3b shows another time-resolved pulse shape of the output beam of the laser system of FIG. 1, particularly illustrating several predefined intervals in the overall pulse shape, wherein changes over one or more of the intervals are compared with a reference waveform to calculate a deviation signal.

A sixth exemplary technique that may be employed to calculate a regulation or deviation signal is the integration of the temporal waveform of the laser pulse in two, three or more pre-defined time intervals being proportional to the relevant energy content of the laser pulses during these time periods and to compare the energy content of these intervals with a stored reference laser pulse that was recorded, e.g., at the beginning of the operation of the laser (see FIG. 3b). The calculated correction parameters (referring to the reference pulse) are:

$$dI_n = (I_n - I_{refn})/I_{refn}, \text{ with } n=1, 2, 3, \ldots$$

where $dI_n$ is the relative difference between the integral of peak number n of the current pulse and the reference pulse. FIG. 3b shows a temporal pulse shape wherein three intervals $I_1$, $I_2$, and $I_3$ are pre-selected as being the energy contents between times $b_0$ and $b_1$, $b_1$ and $b_2$, and $b_2$ and $b_3$, respectively.

The time intervals will typically be chosen in a way that they contain one or several extrema (min. or max.) of the laser intensity. In a preferred version that avoids error signals due to drifts of the pulse shape detector (fast photodiode or pyroelectric detector, e.g.), all laser pulses are normalized to an energy content of one (by integration of the total pulse shape), as the laser energy is kept constant in energy stabilized mode.

An advantage of the sixth exemplary technique is that potential errors that occur when peak detection schemes are used, caused mostly by erratic temporal spikes, are avoided. The sixth technique uses changes in the entire temporal waveform rather than a single point in time.

Figure 4:
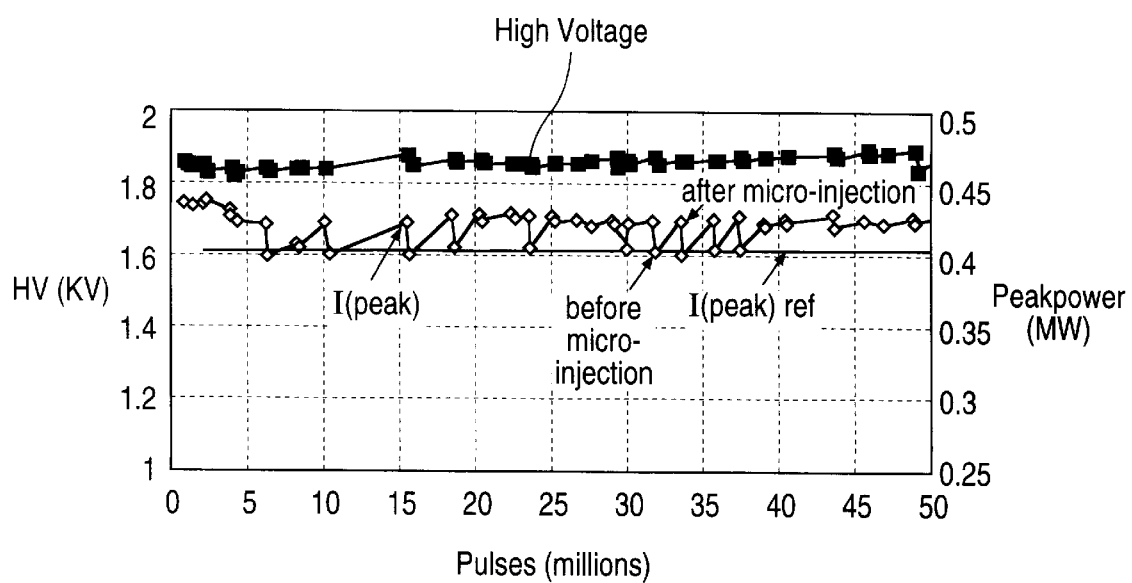
FIG. 4 shows how a measured peak pulse intensity of a single maxima of the entire pulse of the output beam of the laser system of FIG. 1 varies sensitively with gas actions, wherein the driving voltage (and although not shown, the overall pulse energy) remain relatively undisturbed.
Figure 5:
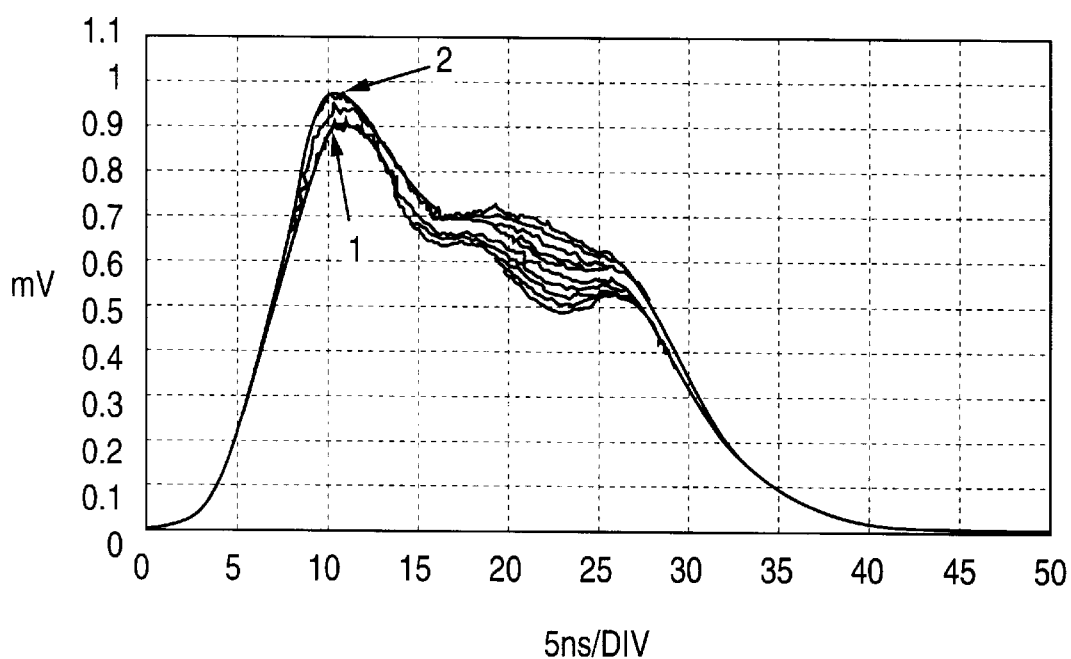
FIG. 5 shows several pulse shapes measured over a laser run of some 50 million laser pulses and illustrates how the pulse shape varies only within a small window over the entire laser run, in accord with the present invention.

FIGS. 4 and 5 illustrate a preferred method according to the present invention wherein gas replenishment is performed based on monitoring the pulse shapes of the output pulses of a KrF laser system emitting around 248 nm over a run of about 50 million pulses. FIG. 4 shows how a measured peak pulse intensity (plot B labeled "I(peak)" of a single maxima of the entire pulse shape of the output pulses of the laser system of FIG. 1 varies sensitively with gas actions, i.e., the halogen concentration in the gas mixture, whereas the driving voltage (plot E labeled "high voltage") (and although not shown, the overall pulse energy) remain relatively undisturbed. FIG. 4 gives an example of the implementation of the apparatus with the peak detection scheme discussed above as the second exemplary technique.

The straight line in FIG. 4 labeled $I(peak)_{ref}$ and indicated by arrow A is the reference peak power which was set to 0.4 MW in this example. The plot indicated by arrow B was derived from a series of measured peak intensities over the 50 million pulse run, in accord with the second exemplary technique described above. Arrow C points to a data point measured just before a micro-halogen injection (labeled "before micro-injection") and arrow D points to a data point measured just after the micro-halogen injection (labeled "after micro-injection"), illustrating the effect of the micro-halogen injection on the peak intensity in the output pulse shapes of the output pulses of the laser system. Plot E (labeled "high voltage") is a plot of the driving high voltage of the discharge circuit of the laser system, as mentioned above.

Whenever the measured peak power fell below the reference value $I(peak)_{ref}$ during the run, a micro-injection of halogen was initiated. After each injection, the measured peak power was observed to increase above the reference value. Thus, FIG. 4 demonstrates how the peak intensity can be stabilized between 0.40 and 0.44 MW, i.e. within 10% accuracy or better.

FIG. 5 shows the entire measured pulse shapes corresponding to the peak intensities plotted as plot B in FIG. 4. Two groups of pulse shapes are clearly distinguished in FIG. 5. Those pulse shapes indicated as "1" are the output pulse shapes measured just before a micro-injection. The pulse shapes indicated as "2" are the output pulse shapes measured just after a micro-injection.

Figure 6:
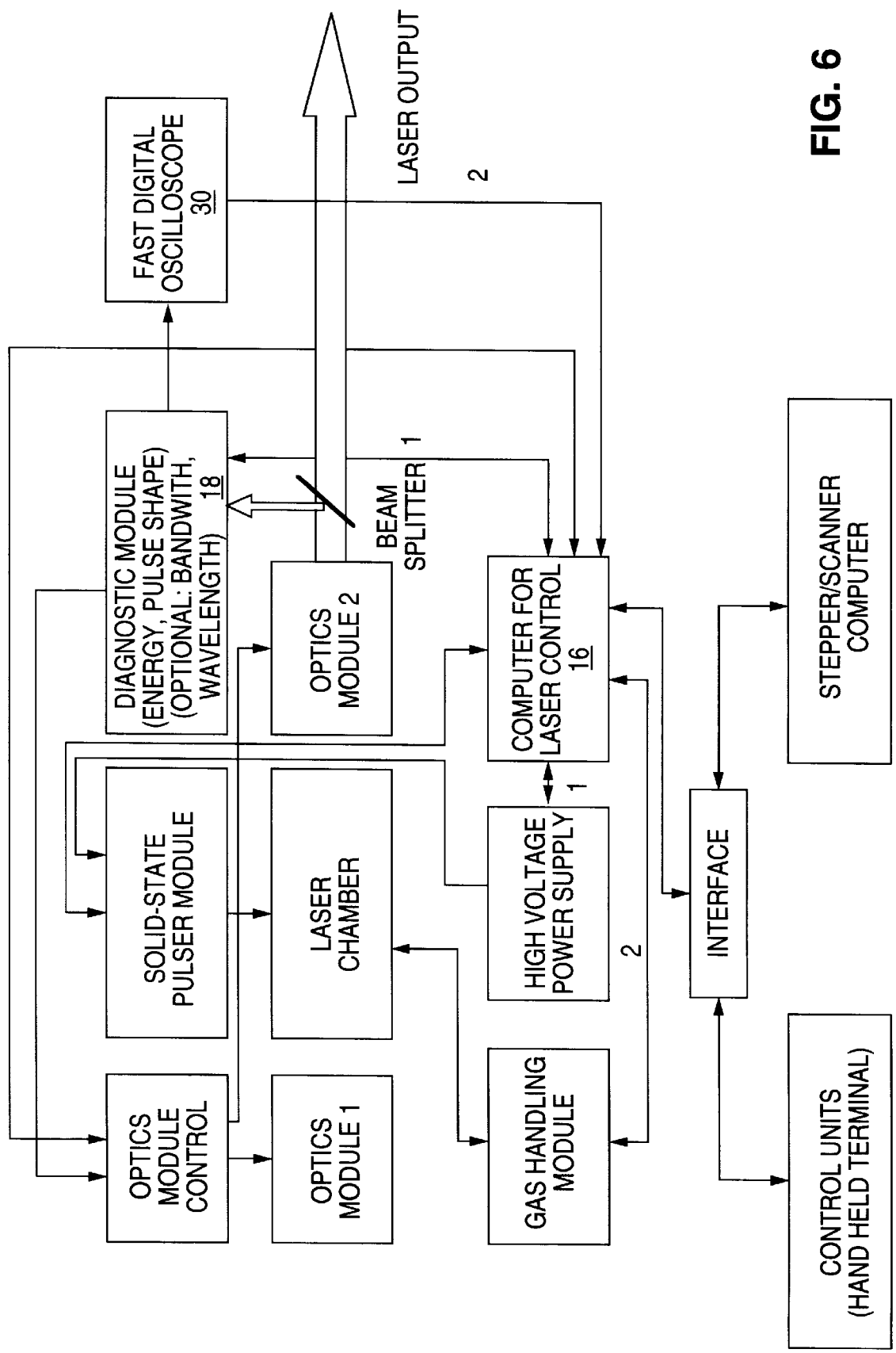
FIG. 6 shows a schematic block diagram of a laser system in accord with a second embodiment of the present invention.

FIG. 5 illustrates how the pulse shapes of the output pulses of the laser system vary over an entire laser run. In accord with the present invention, the pulse shapes do not vary much because gas actions are performed to maintain the pulse shape around the preset pulse shape FIG. 6 shows a schematic block diagram of a laser system in accord with a second embodiment of the present invention. The difference between the laser system of FIG. 6 and that of FIG. 1 is that the system of FIG. 6 includes a fast digital oscilloscope 30 for oscilloscope-type detection of the output temporal pulse shape of the laser system. The particular oscilloscope that is preferred is the Tektronix TEK TDS 210, 60 MHz, 1 GS/s model, although many different oscilloscope models may be used.

Stabilization loop 2 of the laser system of FIG. 6 includes the oscilloscope 30. That is, a detector of the diagnostic module 18 is connected to the oscilloscope 30 which time resolves the pulse shape from the detected beam portion. The pulse shape information is communicated to the computer 16 which otherwise performs the processing described above with respect to FIGS. 1–5.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

What is claimed is:

1. An excimer or molecular fluorine laser system which emits a laser beam during operation and has a gas mixture with a gas composition initially provided within a discharge chamber, comprising:
  a discharge chamber containing a laser gas mixture;
  a plurality of electrodes within said discharge chamber and connected to a discharge circuit for energizing the gas mixture;
  a resonator surrounding said discharge chamber for generating a pulsed laser beam;
  a detector configured to measure a temporal pulse shape of said beam;
  a processor for monitoring the measured temporal pulse shape by said detector;
  a gas control unit for replenishing the laser gas mixture based on the temporal pulse shape measured by said detector,
  wherein the processor signals the gas control unit to initiate a gas replenishment operation to bring a composition of the laser gas mixture within the discharge chamber closer to the initially provided composition, and
  wherein said processor signals said gas control unit to initiate said gas replenishment operation when the processor determines that a composition of the laser gas mixture is deviated a predetermined amount from the initially provided composition based on the monitored temporal pulse shape measured by the detector.

2. The laser system of claim 1, further comprising a processor for receiving a temporal pulse shape signal from said detector indicative of the measured temporal pulse shape and for comparing the measured temporal pulse shape with a reference temporal pulse shape.

3. The laser system of claim 2, the processor further for generating a temporal pulse shape deviation signal based on a difference between said measured temporal pulse shape and said reference temporal pulse shape.

4. The laser system of claim 1, further comprising a processor for receiving a temporal pulse shape signal from said detector indicative of the measured temporal pulse shape and generating a temporal pulse shape deviation signal based on a difference between said measured temporal pulse shape and a reference temporal pulse shape.

5. The laser system of any of claims 3 or 4, wherein the deviation signal is calculated as the square of the difference between intensity data in the measured temporal pulse shape and intensity data in the reference temporal pulse shape summed over a temporal duration of the pulse.

6. The laser system of any of claims 3 or 4, wherein the deviation signal is calculated as the difference between a peak intensity maximum in the measured temporal pulse shape and the corresponding peak intensity maximum in the reference temporal pulse shape.

7. The laser system of any of claims 3 or 4, wherein the deviation signal is calculated as a sum, a sum of absolute values, or a sum of squares of two or more differences between intensity extrema in the measured temporal pulse shape and corresponding intensity extrema in the reference temporal pulse shape.

8. The laser system of any of claims 3 or 4, wherein the deviation signal is calculated as the difference between an intensity extremum in the measured temporal pulse shape and the corresponding intensity extremum in the reference temporal pulse shape.

9. The laser system of any of claims 3 or 4, wherein the deviation signal is calculated as the difference between the ratio of two intensity maxima in the measured temporal pulse shape and the ratio of the corresponding two intensity maxima in the reference temporal pulse shape.

10. The laser system of any of claims 3 or 4, wherein the deviation signal is calculated as the difference between the duration of the measured temporal pulse shape and the duration of the reference temporal pulse shape.

11. The laser system of claim 10, wherein the durations of the measured and reference temporal pulse shapes are the FWHM of the measured and reference temporal pulse shapes, respectively.

12. The laser system of claim 10, wherein the durations of the measured and reference temporal pulse shapes are the time integral squares of the measured and reference temporal pulse shapes, respectively.

13. The laser system of any of claims 3 or 4, wherein the deviation signal is calculated as a difference in energy content over one or more temporal sub-intervals between the overall measured and reference temporal pulse shapes.

14. The laser system of any of claims 3 or 4, the processor further for sending the temporal pulse shape deviation signal to the gas control unit which initiates a gas replenishment action based on said deviation signal.

15. The laser system of claim 14, wherein said detector is further configured to measure the pulse energy of said beam.

16. The laser system of claim 15, said processor for receiving an energy signal from said detector indicative of the measured energy of said beam and for generating an energy deviation signal based on a variation from a preset value of one of pulse energy, pulse energy stability and energy dose stability.

17. The laser system of claim 16, said processor for sending the energy deviation signal to said discharge circuit for adjusting a driving voltage based on the energy deviation signal.

18. The laser system of claim 17, said processor further for sending a second energy deviation signal to said gas control unit for adjusting said gas replenishment action based on said energy deviation signal.

19. The laser system of claim 14, further comprising a second detector configured to measure the pulse energy of said beam.

20. The laser system of claim 19, said processor for receiving an energy signal from said second detector indicative of the measured pulse energy of said beam and for generating an energy deviation signal based on a variation from a preset value of one of pulse energy, pulse energy stability and energy dose stability.

21. The laser system of claim 20, said processor further for sending the energy deviation signal to said discharge circuit for adjusting a driving voltage based on the energy deviation signal.

22. The laser system of claim 21, said processor further for sending a second energy deviation signal to said gas control unit for adjusting said gas replenishment action based said energy deviation signal.

23. The laser system of any of claims 1–3, wherein said detector comprises an oscilloscope which time resolves the temporal pulse shape.

24. The laser system of any of claim 1, said gas control unit for injecting a halogen-containing molecular species into the discharge chamber to replenish the halogen.

25. The laser system of claim 24, said gas control unit for injecting said halogen in amounts and at intervals based on deviations between measured and reference temporal pulse shapes.

26. The laser system of claim 25, wherein said deviations between said measured and reference temporal pulse shapes are maintained at 10% or less due to the injecting of said halogen.

27. The laser system of claim 24, said gas control unit for permitting some of the gas mixture to be released from the discharge chamber.

28. The laser system of any of claim 1, wherein said laser is an excimer laser.

29. The laser system of any of claim 1, wherein said laser is an $F_2$-laser.

30. The laser system of any of claim 1, wherein said laser is a KrF-laser.

31. The laser system of any of claim 1, wherein said laser is an ArF-laser.

32. The laser system of any of claim 1, wherein said laser is a XeF-laser.

33. The laser system of any of claim 1, wherein said laser is a XeCl-laser.

34. The laser system of any of claim 1, further comprising a line-narrowing/selection unit for narrowing the spectral linewidth of said laser.

35. The laser system of any of claim 1, further comprising means for tuning the wavelength of said laser beam.

36. A method of stabilizing output pulses of an excimer or molecular fluorine laser which emits a laser beam during operation and has a gas mixture with a gas composition initially provided within a discharge chamber, comprising the steps of:

monitoring a temporal pulse shape of the laser beam; and adjusting the gas mixture based on the monitored temporal pulse shape, wherein said adjusting step includes signaling a gas control unit to initiate a gas replenishment operation to bring a composition of the laser gas mixture within the discharge chamber closer to the initially provided gas composition, when the processor determines that a composition of the laser gas mixture is deviated a predetermined amount from the initially provided composition based on the monitored temporal pulse share measured by the detector.

37. The method of any of claim 36, wherein said monitoring step includes the step of time resolving the temporal pulse shape of the laser beam.

38. The method of any of claim 36, further comprising the step of comparing the monitored temporal pulse shape with a reference temporal pulse shape.

39. The method of any of claim 36, further comprising the step of calculating a deviation between the monitored temporal pulse shape and a reference temporal pulse shape.

40. The method of claim 39, wherein said calculating step includes the step of calculating the square of the difference between intensities of the monitored and reference temporal pulse shapes summed over the duration of the pulse.

41. The method of claim 39, wherein said calculating step includes the step of calculating the difference between a peak intensity maximum in the monitored temporal pulse shape and the corresponding peak intensity maximum in the reference temporal pulse shape.

42. The method of claim 39, wherein said calculating step includes the step of calculating one of a sum, a sum of absolute values, and a sum of squares of two or more differences between intensity extrema in the measured temporal pulse shape and corresponding intensity extrema in the reference temporal pulse shape.

43. The laser system of claim 39, wherein said calculating step includes the step of calculating the difference between an intensity extremum in the measured temporal pulse shape and the corresponding intensity extremum in the reference temporal pulse shape.

44. The method of claim 39, wherein said calculating step includes the step of calculating the difference between the ratio of two intensity maxima in the monitored temporal pulse shape and the ratio of the corresponding two intensity maxima in the reference temporal pulse shape.

45. The method of claim 39, wherein said calculating step includes the step of calculating the difference between the duration of the monitored temporal pulse shape and the duration of the reference temporal pulse shape.

46. The method of claim 45, wherein the durations of the monitored and reference temporal pulse shapes are the FWHM of the monitored and reference temporal pulse shapes, respectively.

47. The method of claim 45, wherein the durations of the monitored and reference temporal pulse shapes are the time integral squares of the monitored and reference temporal pulse shapes, respectively.

48. The method of claim 39, wherein the calculating step includes the step of calculating the difference between energy contents over one or more temporal sub-intervals within the overall monitored and reference temporal pulse shapes.

49. The method of claim 39, further comprising the step of generating a deviation signal indicative of the deviation between the monitored temporal pulse shape and a reference temporal pulse shape.

50. The method of claim 49, further comprising the step of sending the deviation signal to a gas control unit of the laser system.

51. The method of claim 50, further comprising the step of determining amounts and intervals of gas injections for replenishing the gas mixture of the laser based on the deviation signal.

52. The method of claim 51, further comprising the step of releasing gases from the discharge chamber.

53. The method of any of claim 36, further comprising the step of narrowing the linewidth of the laser beam.

54. The method of claim 53, further comprising the step of tuning the wavelength of the laser beam.

55. The method of any of claim 36, further comprising the steps of measuring the energy of the laser beam and controlling at least one of the driving voltage of a discharge circuit for energizing the gas mixture and the composition of the gas mixture to stabilize at least one of the pulse energy, energy stability and energy dose stability.

56. A method of stabilizing output beam parameters of a pulsed gas discharge excimer or molecular fluorine laser having a gas mixture with a gas composition initially provided within a discharge chamber, comprising the steps of:

monitoring the peak intensity of a temporal pulse shape of the output beam of the laser;

monitoring the energy of the output beam;

adjusting the driving voltage of the discharge circuit of the laser based on the monitored energy; and adjusting the gas mixture with gas replenishment actions based on the monitored peak intensity, wherein said gas mixture adjusting step includes signaling a gas control unit to initiate a gas replenishment operation to bring a composition of the gas mixture within the discharge chamber closer to the initially provided gas composition, when a composition of the laser gas mixture is determined as being deviated a predetermined amount from the initially provided composition based on the monitored temporal pulse shape measured by the detector.

57. The method of claim 56, further comprising the step of adjusting the gas replenishment actions based on the monitored energy.

58. The method of any of claim 56, wherein the gas replenishment actions are adjusted to maintain a substantially constant peak intensity.

59. The method of any of claim 56, wherein the driving voltage and gas replenishment actions are adjusted to control at least one of pulse energy, pulse energy stability and energy dose stability.

* * * * *